(12) United States Patent
Dinger (10) Patent No.: US 11,199,780 B2
(45) Date of Patent: Dec. 14, 2021

(54) REFLECTIVE OPTICAL ELEMENT FOR EUV LITHOGRAPHY AND METHOD FOR ADAPTING A GEOMETRY OF A COMPONENT

(71) Applicant: Carl Zeiss SMT GmbH, Oberkochen (DE)

(72) Inventor: Udo Dinger, Oberkochen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 16/779,817

(22) Filed: Feb. 3, 2020

(65) Prior Publication Data

US 2020/0174378 A1 Jun. 4, 2020

Related U.S. Application Data

(63) Continuation of application No. PCT/EP2018/067934, filed on Jul. 3, 2018.

(30) Foreign Application Priority Data

Aug. 2, 2017 (DE) ...................... 10 2017 213 406.2

(51) Int. Cl.
*G03F 7/20* (2006.01)
*G03F 1/70* (2012.01)

(52) U.S. Cl.
CPC ............ *G03F 7/70166* (2013.01); *G03F 1/70* (2013.01); *G03F 7/70033* (2013.01); *G03F 7/7095* (2013.01); *G03F 7/70625* (2013.01)

(58) Field of Classification Search
CPC .... G03F 7/70166; G03F 1/70; G03F 7/70033; G03F 7/70625; G03F 7/7095;
(Continued)

(56) References Cited

U.S. PATENT DOCUMENTS 6,984,475 B1 1/2006 Levinson et al.
2004/0253426 A1 12/2004 Yakshin et al.
(Continued)

FOREIGN PATENT DOCUMENTS

| DE | 10150874 A1 | 4/2003 |
|---|---|---|
| DE | 102005025624 A1 | 12/2006 |
| WO | 2009084296 A1 | 7/2009 |

OTHER PUBLICATIONS

German Office Action with English translation, Application No. 10 2017 213 406.2, dated Mar. 20, 2018, 7 pages.
(Continued)

*Primary Examiner* — Mesfin T Asfaw
(74) *Attorney, Agent, or Firm* — Edell, Shapiro & Finnan LLC (57) ABSTRACT

A reflective optical element (1) for reflecting light having at least one wavelength in an EUV wavelength range has an optically effective region configured for reflecting the light incident on a surface (2) of the optically effective region. The reflective optical element (1) has an edge (4) forming at least part of a boundary of an edge-free surface (3) of the reflective optical element (1), wherein the edge-free surface (3) includes the surface (2) of the optically effective region. The edge (4) has a chamfer and/or a rounding. Also disclosed is a method for adapting a geometry of at least one surface region of a component of an optical arrangement, for example of a reflective optical element (1).

23 Claims, 5 Drawing Sheets

(58) Field of Classification Search
CPC ...... G03F 7/70916; G03F 7/7015; G03F 1/24; G21K 2201/067; G21K 1/062
See application file for complete search history.

(56) References Cited

U.S. PATENT DOCUMENTS

| | | |
|---|---|---|
| 2006/0273732 A1 | 12/2006 | Korobochko et al. |
| 2007/0009812 A1 | 1/2007 | Ito et al. |
| 2014/0234755 A1* | 8/2014 | Sasaki ...................... G03F 1/38 430/5 |
| 2015/0079501 A1* | 3/2015 | Shoki ........................ G03F 1/80 430/5 |

OTHER PUBLICATIONS

International Preliminary Report on Patentability and the Written Opinion, PCT/EP2018/067934, dated Feb. 4, 2020, 3 pages.
Janev et al., "Collision Processes in Low-Temperature Hydrogen Plasmas", Macedonian Academy of Science and Arts, (2003), 188 pages.
Mendez et al., "Atom and Ion Chemistry in Low Pressure Hydrogen DC Plasmas", J. Phys. Chem. a (2006), pp. 6060-6066.
International Search Report, PCT/EP2018/067934, dated Oct. 19, 2018, 4 pages.

* cited by examiner

REFLECTIVE OPTICAL ELEMENT FOR EUV LITHOGRAPHY AND METHOD FOR ADAPTING A GEOMETRY OF A COMPONENT

CROSS REFERENCE TO RELATED APPLICATIONS

This is a Continuation of International Application PCT/EP2018/067934, which has an international filing date of Jul. 3, 2018, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2017 213 406.2 filed on Aug. 2, 2017.

FIELD OF THE INVENTION

EUV lithography apparatuses are used to produce microstructured or nanostructured components of microelectronics or microsystem technology using optical lithography. Such projection lithographic apparatuses comprise an illumination system for illuminating a photomask (a reticle) with light of a narrow spectral range around an operating wavelength. Further, said apparatuses comprise a projection lens for projecting a structure of the reticle onto a light-sensitive layer of a wafer using the light.

BACKGROUND

New projection lithographic apparatuses are designed for an operating wavelength of, e.g., 13.5 nanometers, i.e., a wavelength in the extreme ultraviolet (EUV) wavelength range, in order to obtain a structure width that is as narrow as possible for the semiconductor component parts to be produced. However, in principle, the use of other wavelengths in the EUV wavelength range, such as, e.g., 6.8 nanometers is also possible. Since wavelengths in this range are strongly absorbed by virtually all materials, it is not possible to use transmissive optical elements, and it is necessary to use reflective optical elements instead. Such reflective optical elements can be, for example, mirrors, reflectively operating monochromators, collimators or photomasks.

The reflective optical elements can also be used in other optical systems used in the context of EUV lithography methods. Examples of these are metrology systems for examining exposed wafers or wafers that are to be exposed, for examining reticles, and for examining further components of the projection lithographic apparatus, such as mirrors.

However, it has been found that operation of the EUV lithography apparatus can lead to occasional defects on the layers or the coating, i.e., on layers of the reflective optical elements that are applied to the mirror substrate for producing the reflective area; these include, by way of example, sputtering defects and delaminations. In particular, this may lead to a reduction in the reflectivity of the reflective optical element, as a result of which the throughput of the EUV lithography apparatus is reduced.

SUMMARY

It is an object of the present invention to provide a reflective optical element that ensures long-lasting and reliable operation of an optical arrangement for EUV light, in which said reflective optical element is disposed. Further, it is an object of the present invention to provide a method for adapting a geometry of at least one surface region of a component of such an optical arrangement.

These objects are achieved by a reflective optical element of the type set forth at the outset, said reflective optical element having an optically effective region that is configured to reflect light incident on a surface (illuminated region) of the optically effective region. Further, the reflective optical element has an edge forming at least part of a boundary of an edge-free surface of the reflective optical element, wherein the edge-free surface contains the surface of the optically effective region. The edge has (at least) one chamfer and/or one rounding, at least along an edge section that extends along a direction of extent of the edge.

The EUV wavelength range can be defined as a wavelength range of between 5 nanometers and 20 nanometers. The optically effective region can be configured to reflect light about an operating wavelength. The operating wavelength may lie in the EUV wavelength range. By way of example, the operating wavelength can be 13.5 nanometers or 6.8 nanometers. By way of example, the reflective optical element can be a concave or convex mirror. The reflective optical element can have a substrate body. The substrate body can have an integral embodiment. The substrate body with an integral embodiment can be manufactured from one material or a composite of different materials. By way of example, the composite can be multi-layered. The substrate body can be manufactured from an electrically conductive material, for example a metal, in particular aluminum. Alternatively, the substrate body can be manufactured from ULE® or Zerodur®, for example. The substrate body can be conductive and/or be provided with a conductive coating, at least in one portion. The conductive coating can cover the rounded and/or chamfered edge section or adjoin said edge section. The edge can be processed to be burr-free, at least along the edge section.

The optically effective region can have a coating with one or more layers that is applied to the substrate body. The (multiple ply) coating can be configured in such a way that the it acts as an interference layer system for the operating wavelength and for a predetermined range of angles of incidence.

The edge section can extend along the direction of extent of the edge, at least over a length of 5 millimeters, 10 millimeters or 20 millimeters. The edge can be an outwardly directed edge, i.e., an outer edge. The edge can form a step. The edge can run around the edge-free surface in full or in part. The surface of the optically effective region or the edge-free surface can be electrically conductive. The edge-free surface can be embodied in such a way that all surface radii of curvature are greater than 50 millimeters or greater than 100 millimeters at each point within the edge-free surface. In this context, the expression "within" can exclude the boundary of the edge-free surface, i.e., in particular, the edge bounding the edge-free surface.

The reflective optical element can have a peripheral edge face. The peripheral edge face can run around the edge-free surface in full or in part. The peripheral edge face can be angled relative to the edge-free surface. The peripheral edge face and the edge-free surface can adjoin the edge at each location within the rounded and/or chamfered edge section.

According to one embodiment, the edge has an edge angle with a value of between 30 degrees and 150 degrees at each location within the edge section. The edge angle can be defined as an angle between surface regions that adjoin the edge. In particular, the edge angle can be defined as an angle between the edge-free surface and the peripheral edge face. The edge angle can be defined such that a right angled, outwardly directed edge has an edge angle of 90 degrees. The edge angle can be measured in a cross-sectional plane that extends transversely to the direction of extent of the edge.

A chamfer angle of the chamfer of the edge section, measured at a side of the chamfer adjoining the edge-free surface, can be greater than 20 degrees or greater than 30 degrees. The chamfer angle can be less than 70 degrees or less than 60 degrees. The chamfer angle can be defined as an angle through which a surface of the chamfer is angled vis-à-vis the edge-free surface, toward a further adjacent surface. By way of example, the further adjacent surface can be the peripheral edge face. The chamfer angle can be measured in a cross-sectional plane that extends transversely to the direction of extent of the edge. The edge can have one or more chamfers.

According to one embodiment, a chamfer width of the chamfer has a value that is greater than 1 millimeter, greater than 2 millimeters or greater than 4 millimeters or greater than 10 millimeters. The chamfer width can be measured along the surface of the chamfer, to be precise in a cross-sectional plane extending transversely to the direction of extent of the edge.

According to a further embodiment, a minimum rounding radius of the rounding is greater than 1 millimeter or greater than 2 millimeters or greater than 5 millimeters or greater than 10 millimeters at each location within the edge portion. The minimum rounding radius can be measured in a cross-sectional plane that extends transversely to the direction of extent of the edge.

In a further embodiment, at least part of a substrate body of the reflective optical element is manufactured from an electrically conductive material, for example a metal, in particular from aluminum; and/or at least one region of the edge-free surface adjoining the edge section has a conductive layer, for example a capping layer of a coating.

The EUV radiation used in an EUV lithography apparatus represents ionizing radiation. It produces a plasma, for example a hydrogen plasma, by way of photoionization of a background gas present in the EUV lithography apparatus, said background gas possibly containing hydrogen, for example. Provided its energy is high enough—typically greater than 10 eV—, out-of-band radiation, i.e., photons in the light beam or in the beam path at wavelengths outside of the used wavelength range, produced by the light source may also contribute to the ionization of the background gas. The plasma substantially fills the entire available volume of a vacuum environment in the EUV lithography apparatus and typically lies at a positive potential, which drops to the ground potential in a comparatively thin plasma sheath at the grounded boundaries, e.g., at walls of vacuum chambers.

It was found that a localized overshoot of the electric field may occur at the (sharp) edges of electrically conductive materials that are exposed to a plasma. The ions now follow these electric field lines, specifically with a constant speed as a result of a drift in the case of sufficiently high hydrogen partial pressures or in accelerated fashion in the case of sufficiently low hydrogen partial pressures.

In the drift-dominated range of the hydrogen partial pressure, the (ion) flux is given by flux=$\mu$*E*n–D*grad(n), where $\mu$ denotes the mobility of the ions, assumed to have positive charge here, E denotes the field strength, n denotes the ion density and D denotes the diffusion constant. Therefore, an overshoot of the ion flux is expected at points of increased field strength E in the case of constant ion density n. As explained in more detail below, the overshooting ion flux contributes to an overshooting density of hydrogen radicals also occurring at the points of increased field strength. The overshooting ion flux density, and the overshooting density of hydrogen radicals coupled therewith, may have as a consequence increased damage to layers at such edges provided no countermeasures in relation to this effect are adopted by virtue of the overshoot of the electric field strength E being counteracted by virtue of rounding the edge.

According to a further embodiment, the optically effective region is configured for reflecting the light at an angle of incidence of greater than 60 degrees or greater than 65 degrees or greater than 70 degrees. The angle of incidence can be measured between a direction of incidence of the light and a surface normal of the surface of the optically effective region. Expressed differently, the reflective optical element can be configured as a mirror for grazing light incidence (grazing incidence mirror). The optical element can be coated by a single or multiple ply layer system, at least in the optically effective region. By way of example, a ruthenium layer can be applied in the optically effective region.

According to a further embodiment, the optically effective region has alternating layers made of a first layer material and made of a second layer material. Expressed differently, the reflective optical element can be configured as a mirror for small angles of incidence (normal incidence mirror). The alternating layers can be configured as a multiple ply layer system. The multiple ply layer system can act as an interference layer system for the operating wavelength. By way of example, the multiple ply layer system can have alternating layers of molybdenum and silicon.

Further, the object is achieved by an optical arrangement for light having at least one wavelength in an EUV wavelength range. The optical arrangement comprises a reflective optical element as per one of the embodiments described above. The reflective optical element is disposed in a beam path of the light. Further, the optical arrangement comprises a structured object. The optical arrangement is embodied to illuminate the structured object using the light and to project structures of the structured object onto an image plane. By way of example, the structured object can be a reflective photomask or a plurality of micromirrors. The optical arrangement can be configured as a projection lithographic arrangement. The projection lithographic arrangement can be configured to expose wafers.

According to one embodiment, the reflective optical element is the reflective optical element disposed adjacent to and upstream of the structured object, as seen along the beam path. Expressed differently, reflected light beams of the light, which are reflected by the reflective optical element, are incident light beams, which are incident on the structured object, at the same time.

According to a further embodiment, reflected light beams of the light, which are reflected by the structured object, or generally light beams of the beam path of the EUV radiation, approach the edge, in particular the edge section, to within a distance of less than 50 mm, less than 20 mm, less than 10 mm or less than 1 mm. It was found that the negative effects of the hydrogen plasma occur in more pronounced fashion in the case of a small distance of the light guided past the edge. This applies not only to light beams reflected by the structured object but applies in general to the case where light beams, or the beam path of the EUV light, approach the edge, in particular the edge section, to within a distance of, for example, less than 50 mm, less than 20 mm, less than 10 mm or less than 1 mm.

Likewise, the reflective optical element could be the reflective optical element disposed adjacent to and downstream of the structured object, as seen along the beam path. Expressed differently, reflected light beams of the light, which are reflected by the structured object, are incident light beams, which are incident on the reflective optical element, at the same time.

The reflective optical element can be a reflective optical element with facets, for example a facet mirror of an illumination system of an EUV lithography system. In this case, the edge-free surface can form a facet face—typically movable, in particular tiltable, about at least one axis—of a facet element of the facet mirror. At least one facet element, typically all facet elements, of the reflective optical element with facets can have an embodiment as described above and can have an edge with at least one edge section with a chamfer and/or with a rounding.

Further, the object is achieved by a method for adapting a geometry of at least one surface region of a component of an optical arrangement. The optical arrangement is configured for light having at least one wavelength in an EUV wavelength range. The component is disposed in a vacuum chamber that contains residual gas. The method comprises a determination of at least one value of a plasma-dependent parameter, wherein the plasma-dependent parameter depends on a plasma that is produced by an interaction of the light with at least some of the residual gas. Further, the method comprises an adaptation of the geometry of the surface region of the component on the basis of the value of the plasma-dependent parameter.

The residual gas in the vacuum chamber can have a residual gas pressure in a range of between 0.1 Pa and 20 Pa, in particular between 1 Pa and 10 Pa. By way of example, the residual gas can have hydrogen as a plasma-producing constituent. In addition or as an alternative thereto, the residual gas can have argon, helium, oxygen and/or nitrogen as a plasma-producing constituent. Together, the plasma-producing constituents can generate a partial pressure of between $10^{-8}$ Pa and 1 Pa. The partial pressure of the plasma-producing residual gas constituents can be set in such a way that the light with the wavelength in the EUV wavelength range produces the plasma during the operation of the optical arrangement.

Determining the values of the plasma-dependent parameter can comprise: determining values of the plasma-dependent parameter at a plurality of different spatial locations and/or for different times. The spatial locations can be locations on the edge, on the edge-free surface and/or the peripheral edge face. The different times may be situated within a light pulse of the employed light.

According to a further embodiment, the component has an edge, in particular an outwardly directed edge. The edge can form at least one region of a boundary of an edge-free surface of the component. The edge can form a step. The adapted surface region has an edge section of the edge.

A geometry of the edge can be adapted by adapting the surface region. Adapting the geometry of the edge can comprise an adaptation of a geometry of the edge in a cross-sectional area, the cross-sectional area extending transversely to a direction of extent of the edge. Expressed differently, adapting the geometry of the edge may comprise an adaptation of a geometry of an edge profile of the edge.

According to a further embodiment, the component is a reflective optical element of the optical arrangement. The reflective optical element can have an optically effective region that is configured to reflect the light incident on a surface of the optically effective region. The edge-free surface can include the surface of the optically effective region.

According to a further embodiment, adapting the surface region of the component comprises a determination of a value and/or a value range of one of the following parameters or a combination of the following parameters: a radius of curvature, in particular a minimum radius of curvature, of a rounding of the edge in the edge section; a chamfer angle of the edge in the edge section; and/or a chamfer width of the edge in the edge section. The determination can be implemented on the basis of the value of the plasma-dependent parameter.

According to a further embodiment, the adapted surface region is a portion of a surface of the component. The method can comprise a determination of the portion within the surface on the basis of the value of the plasma-dependent parameter. By way of example, the portion can be determined on the basis of a threshold for the plasma-dependent parameter.

According to a further embodiment, the method further comprises a determination of the component from a plurality of components of the optical arrangement on the basis of a chemical composition of the respective component.

According to a further embodiment, the component is determined on the basis of a proportion of one element or a combination of the following elements in the respective component: tin, zinc, phosphorus, silicon, lead and/or fluorine.

According to a further embodiment, the plasma-dependent parameter is one of the following parameters: a flux density of one or more ion species of the plasma; a flux density of one or more neutral species of the plasma; a flux density of one or more radical species of the plasma; or an electron flux density. The ion species may include $H_2^+$, $H_3^+$, $H^+$ and/or $H^-$, in particular if hydrogen is used as a residual gas component. A species can be defined by the charge state, the number and atomic number (i.e., element) of the atoms and/or by the excitation state.

In addition or as an alternative thereto, the ion species can include Ar+, in particular if argon is used as residual gas constituent. In addition or as an alternative thereto, the ion species can include He+, in particular if helium is used as residual gas constituent. In addition or as an alternative thereto, the ion species can include $O_2^+$, $O^+$, $O^-$ and/or $O_2^-$, in particular if oxygen is used as residual gas constituent. In addition or as an alternative thereto, the ion species can include $N_2^+$, $N^+$ and/or $N^{(2+)}$, in particular if nitrogen is used as residual gas constituent.

More complicated molecular ions, such as, e.g., $N_2H^+$, can also occur.

According to a further embodiment, the plasma-dependent parameter is a plasma potential, a plasma density, an electron density or an electric field strength. The electric field strength can be produced by the plasma.

According to a further embodiment, the method further comprises a determination of a spatial intensity distribution of the light. The value of the plasma-dependent parameter can be determined on the basis of the spatial intensity distribution of the light.

According to a further embodiment, the plasma is produced from an interaction of the light with one of the following substances or a combination of the following substances as a constituent of the residual gas: hydrogen, argon, helium, oxygen and/or nitrogen.

Embodiments provide a computer program product, comprising program parts that, when loaded onto a computer, are designed to carry out a method as per any one of the above-described embodiments for the method. The computer program product can be stored on a non-transitory computer storage apparatus.

BRIEF DESCRIPTION OF THE DRAWINGS

Exemplary embodiments relating to the present disclosure are illustrated in the schematic drawings and are explained in the following description.

In the figures.

DETAILED DESCRIPTION

Figure 1:
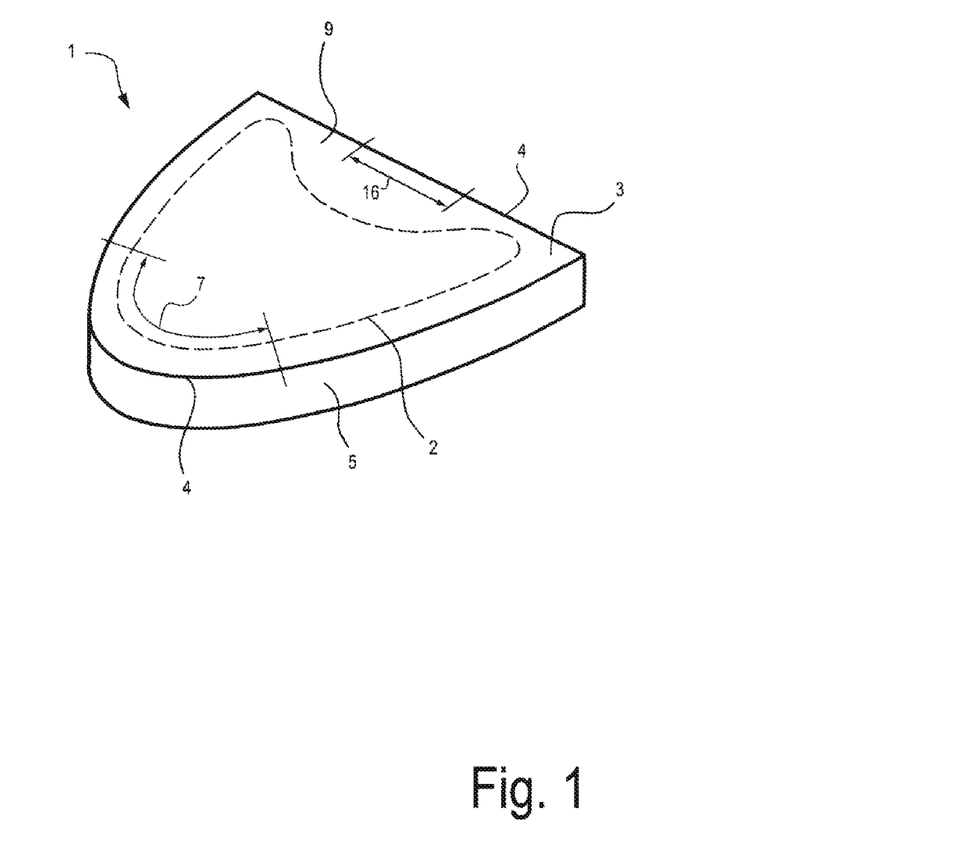
FIG. 1 shows a schematic perspective illustration of a reflective optical element, which is operated under grazing incidence.

FIG. 1 shows a schematic perspective illustration of a reflective optical element 1. The reflective optical element 1 is part of an EUV lithography apparatus 101, shown in FIG. 5, for projecting a structure of a structured object M (such as a reflective photomask, for example) onto an image plane, in which a surface of a substrate W (e.g., a wafer) is disposed. The projection is implemented using EUV light of a wavelength range containing an operating wavelength of 13.5 nanometers. However, it is also possible for the EUV lithography apparatus 101 to be configured for a different operating wavelength in the EUV wavelength range, such as 6.8 nanometers, for example.

Figure 5:
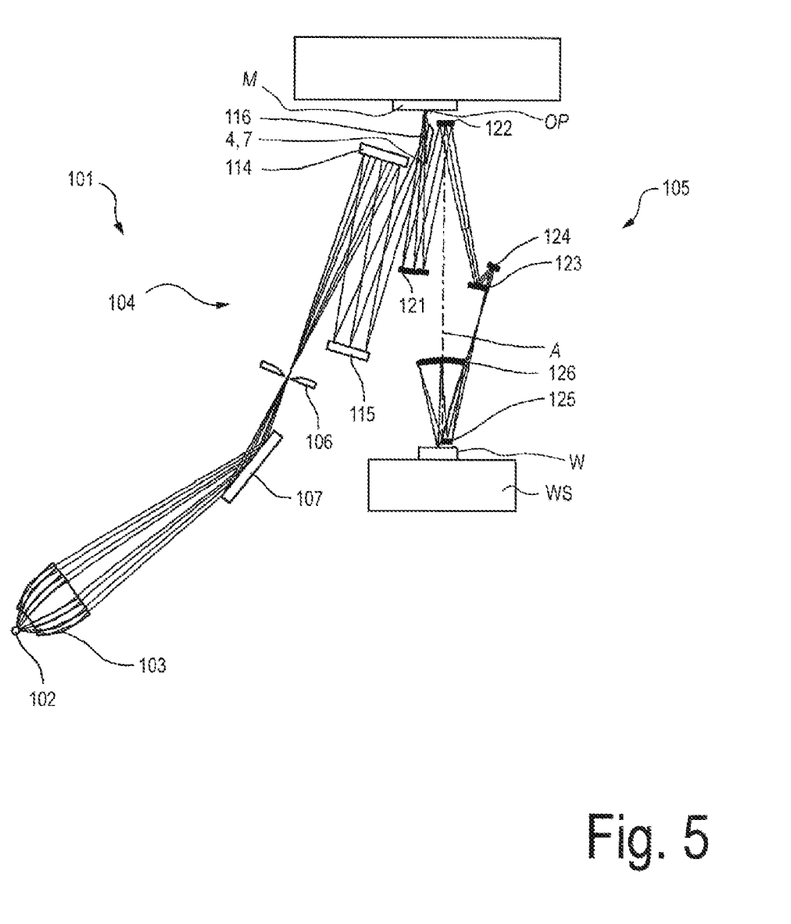
FIG. 5 shows a schematic illustration of a projection lithographic arrangement, in which the reflective optical element shown in FIG. 1 is usable.

The reflective optical element 1 shown in FIG. 1 is the reflective optical element 116 that is disposed upstream of and adjacent to the structured object M in the illumination beam path 104 of the EUV lithography apparatus 101 shown in FIG. 5. The reflective optical element 116 is configured as a mirror for grazing light incidence (grazing incidence mirror). The structure of the EUV lithography apparatus 101 shown in FIG. 5 is explained in detail below.

It should be noted, however, that the advantages and features of the present disclosure presented below relate not only to the reflective optical element 116 but also, in particular, to the remaining reflective optical elements 103, 107, 114, 115, 121, 122, 123, 124, 125 and 126, shown in FIG. 5, which are configured as mirrors for small angles of incidence (normal incidence mirror). Further, the advantages and features of the present disclosure presented below also relate to the structured object M, i.e., to the reflective photomask, in particular.

As illustrated in FIG. 1, the reflective optical element 1 has a mirror substrate 9. The mirror substrate 9 has an integral embodiment and is manufactured from aluminum by milling. A coating that can have one or more layers is applied to a surface region of the mirror substrate 9. The surface region in which the coating is applied can be, for example, a polished surface region, in particular a super-polished surface region. The surface of the coating comprises at least one illuminated region 2 of an edge-free surface 3. The illuminated region 2 is illuminated by EUV light during the operation of the EUV apparatus and forms a surface 2 or a surface region of the optically effective region. The coating aids in providing an optically effective region that is configured to reflect the EUV light. In the shown example, the entire edge-free surface 3 is covered by the coating, which is not pictorially represented in FIG. 1, and forms the optically effective region. The edge-free surface 3 has a geometry that is suitable for producing the optical effect of the reflective optical element 116.

In the shown example, the coating is formed by a capping layer only. The capping layer can be formed, for example, from ruthenium. The capping layer is applied directly to the mirror substrate 9. However, one or more further layers could be situated between the capping layer and the mirror substrate 9. By way of example, such layers can be absorber layers, layer tension compensation layers and/or adhesion promoting layers. A further example for such layers between the capping layer and the mirror substrate 9 is that of a multiple layer system, which is configured as an interference layer system in order to provide a high reflectivity for the reflective optical element 1 over a comparatively large range of angles of incidence.

The edge-free surface 3 is bounded by an edge 4, which surrounds the edge-free surface 3. Part of the edge 4 forms a transition from the edge-free surface 3 to a round edge face 5 extending along the periphery.

In the embodiment described here, the coating on the mirror substrate 9 was found to be damaged by the operation of the EUV lithography apparatus 101, with sputtering defects and delaminations existing at various locations. Further, these defects were found to occur in comparatively pronounced fashion at surface regions of the mirror substrate 9 that are situated within or in the vicinity of the edge sections 7 and 16 of the edge 4. The (partial) delaminations, in particular, lead to a deterioration in the imaging quality of the EUV lithography apparatus 101. Additionally, the partial detachment of the layers may lead to the accumulation of inadmissibly many particles on optical components of the EUV lithography apparatus, in particular on the structured object M (such as the reflective photomask, for example).

It could be shown that the defects on the coating, for example in the form of sputtering defects, delaminations and particle accumulations, can be traced back to a hydrogen plasma that forms during the operation of the EUV lithography apparatus. The hydrogen is added to the residual gas of the EUV lithography apparatus 101 in order to clean, with the aid of the hydrogen plasma, the surfaces of the optically effective regions of optical elements in respect of contaminations. By way of example, such contaminations can be carbon accumulations or oxidation contaminations.

The evidence that the hydrogen plasma is the cause for the defects at the coating, for example in the form of sputtering defects, delaminations and particle accumulations, was provided by a simulation of the plasma and by a comparison of the results with the damaged surface regions of the mirror substrate 1. Calculated plasma-dependent parameters were used for the comparison, for example the flux density of the simulated ionized species of the plasma.

As a result, it was possible to show that the defects are not produced by direct irradiation by the EUV light but by an action of the hydrogen plasma. This is also expressed by the fact that at least some of the defects, for example in the form of sputtering defects and delaminations, occur at surface regions that are disposed outside of the illuminated region 2.

Since EUV light has a photon energy of approximately 92 eV, for example, and the ionization energy in argon and hydrogen is found in the region of approximately 15 eV, the EUV light has an ionizing effect on the hydrogen. Thus, if the hydrogen is exposed to the EUV light, a hydrogen plasma is formed. The photoabsorption cross section is determined virtually entirely by the various ionization channels (single, dual, dissociative photoionization). The photoelectrons formed in a photoabsorption process have sufficient energy to produce further secondary ionizations. Moreover, the EUV light releases low-energy photoelectrons with energies of a few electron volt from surfaces (photoelectric effect), for example from the irradiated region 2 of the reflective optical element 1. As is evident from FIG. 5, light beams of the EUV light that were reflected at the structured object M approach the edge sections 7 and 16 of the reflective optical element 116 to within a distance of less than 50 millimeters, or even less than 20 millimeters, less than 10 millimeters or less than 1 millimeter. The above-described effects of the hydrogen plasma (e.g., sputtering defects, delaminations and particle accumulations) were found to occur more pronouncedly at a shorter distance. The small distance emerges, in particular, from the negative input back focus of the lithography apparatus 101.

The interaction of the EUV light with hydrogen and the photoemission lead to the formation of different ion species (such as $H_2^+$, $H_3^+$, $H^+$, and $H^-$, for example) and to the formation of different neutral species (such as $H_2^*$, H and H*, for example). A multiplicity of electronic and molecular collision processes also contribute to the formation of these ion and neutral species.

For cleaning purposes or for the purposes of avoiding contamination, other gases such as argon, helium, oxygen and/or nitrogen could also be supplied to the residual gas in addition or as an alternative to hydrogen. But also in these cases, a plasma is produced by the interaction of the EUV light with the gases and by photoemission, such that the plasma may cause the optically effective regions of the reflective optical elements to be cleaned. However, sputtering defects, delaminations at the coating of the mirror substrate and particle accumulations as a result of the detachment of the layers may nonetheless occur in this case, too.

The emergence of the defects, for example in the form of the sputtering defects, the delaminations and the particle accumulations, was shown to depend, in particular, on a plasma-generated electric field strength at surface regions of the substrate body 9, said electric field strength arising from a potential difference between the plasma core and the surface region. This will be explained in more detail below.

A potential difference forms between the plasma core and a surface at least partly bounding the plasma. This potential difference is generated by a plasma sheath (also referred to as Debye sheath), which forms between the plasma core and the bounding surface. By way of example, the bounding surface may be formed here by a surface region of the substrate body 9 shown in FIG. 1. The electrons in the plasma have a similar temperature to or higher temperature than the ions but have a lower mass and hence a higher speed than the ions. Therefore, the electrons are removed from the plasma by the bounding surface to a greater extent than the ions.

As a consequence, a potential difference forms between the plasma and the bounding surface on account of the principle of quasineutrality; said potential difference decelerating the electrons and accelerating the ions to the bounding surface. Without the principle of quasineutrality or the plasma potential, the space charge within the plasma would continually increase. However, the principle of quasineutrality can be infringed, at least occasionally or locally, in an EUV lithography system during the pulsed excitation, i.e., during a respective EUV light pulse that has a pulse duration of, as a rule, between approximately 10 ns and approximately 100 ns in the case of an EUV light source in the form of an LPP (laser produced plasma) light source and that has a pulse duration of, as a rule, less than one ps in the case of an EUV light source comprising a free electron laser. Since the electrons can be lost to a greater extent at the bounding surface even in the case of a non-conductive bounding surface, a potential difference may also be formed between the plasma core and the bounding surface in this case, with the potential of the bounding surface being a floating potential in this case.

The electric field produced by the potential difference between the plasma and the bounding surface and, further, plasma density gradients and thermal motions, too, generate a flux of ionized species of the plasma toward the bounding surface. The flux of neutral species to the bounding surface is determined by diffusion, in particular, although it may also be coupled to the flux of the $H_2^+$ ions by way of the very dominant reaction $$H2^+ + H_2 \rightarrow H_3^+ + H.$$

Furthermore, recombinations, reflections and/or surface reactions occur at the bounding surface. As a result, hydrogen radicals are formed with a comparatively high reaction rate by the following reaction:

$$H_3^+ + \text{wall} \rightarrow H_2 + H.$$

As a consequence, hydrogen radicals are generated at the bounding surface with a rate that is coupled to the flux of the $H_3^+$ ions to the bounding surface. (A similar statement applies to the H+ recombination $$H^+ + \text{wall} \rightarrow H.$$

at the wall.) Advantageous effects can be produced by the hydrogen ions and radicals at the bounding surface, for example a cleaning effect, but disadvantageous effects can also be produced; for example, defects can be produced and/or enlarged at the bounding surface. Knowledge or control of the corresponding flux densities at the bounding surfaces is therefore advantageous.

With the aid of simulations of the plasma, it was possible to show that the potential difference between a plasma core, which lies at a positive potential in relation to the bounding surfaces, e.g., grounded chamber walls and other components, can lead to field strengths in the region of a few kV/m in an EUV lithography system. The field strengths are high at those locations, in particular, at which an electric peak effect occurs, for example at the edges of the substrate bodies. In correspondence herewith, the simulation also showed that the flux density of ionized species of the plasma is comparatively high at these locations. As a result of the above-described coupling of the flux of hydrogen radicals to the flux of $H_3^+$ ions, there is also an increased density of hydrogen radicals at the locations where an electric peak effect occurs.

These effects can be amplified by virtue of a higher plasma density possibly setting-in locally as a consequence of an inhomogeneous plasma production, which originates from the three-dimensionally very structured intensity distribution of the radiated-in EUV light.

A comparison with the defects that have occurred, for example in the form of sputtering defects and delaminations, has finally shown that these locations with elevated field strength and with elevated flux density of ionized species correlate with the sites of defects in the substrate bodies. A correlation with the flux density of hydrogen radicals could also be determined.

However, as described in more detail below, it was possible to show that the defects, for example in the form of sputtering defects, delaminations and particle accumulations, can be prevented or suppressed by adapting a geometry of the substrate body 9. Further, it was possible to show that such an adaptation of the geometry of the substrate body 9 can be carried out particularly efficiently on the basis of a determination of values of one or more plasma-dependent parameters, as described in more detail below on the basis of FIGS. 2A-2D.

Figure 2A:
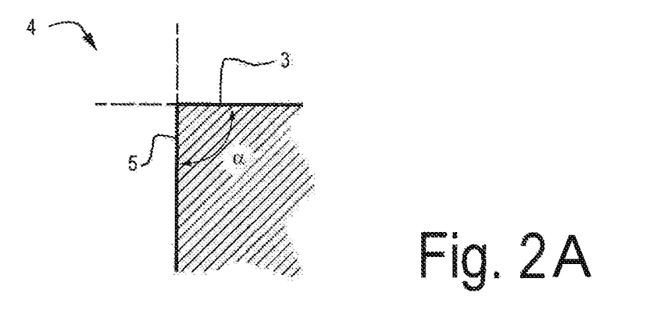
FIG. 2A shows a schematic illustration of an edge of the reflective optical element, which is processed to form a chamfer and/or a rounding.

FIG. 2A shows a cross section perpendicular to a direction of extent of the outwardly directed edge 4 in the region of the edge section 7 (shown in FIG. 1). The edge-free surface 3 and the peripheral edge face 5 are adjacent to one another in the region of the edge section 7 and form the edge angle α, which is enclosed by the edge-free surface 3 and the peripheral edge face 5. In the edge section 7, the edge angle α has a value of 90 degrees. However, configurations of the substrate body 9 or of the reflective optical element 1 are possible, in which an edge angle α in the edge section 7 has a value in a range of between approximately 30 degrees and approximately 150 degrees.

For the reflecting optical element 1 shown in FIG. 1, it was found that defects, for example in the form of sputtering defects and delaminations, may occur at the edge 4 shown in FIG. 2A, it being possible to efficiently prevent or at least suppress said defects if the edge 4 is adapted, at least along the edge sections 7 and 16 (shown in FIG. 1), in such a way that said edge has a rounding and/or a chamfer. This will be explained in exemplary fashion below for the edge section 7, with reference being made to FIGS. 2B to 2D.

Figure 2B:
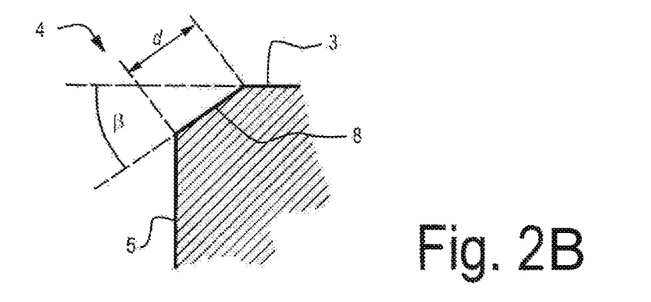
FIGS. 2B-2D show schematic illustrations of exemplary edge profiles of the edge with one chamfer (FIG. 2B), with two chamfers (FIG. 2C) and with a rounding (FIG. 2D)
Figure 2C:
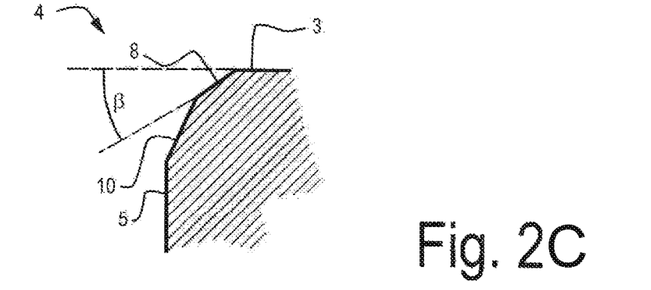
Figure 2D:
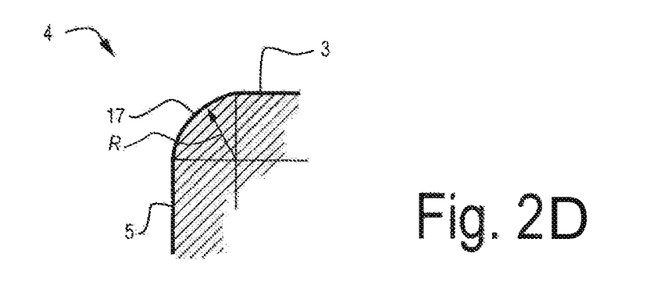

FIG. 2D shows an example of the mirror body, wherein the edge 4 within the adapted edge section 7 has a chamfer 8 that connects the edge-free surface 3 to the peripheral edge face 5. The chamfer angle β having a value of greater than 20 degrees or greater than 30 degrees was found to be advantageous. The chamfer angle β can be less than 70 degrees or less than 60 degrees. As shown in FIG. 2B, the chamfer angle β is measured at a point of the chamfer 8 that adjoins the edge-free surface 3. The chamfer width d of the chamfer 8 has a value that is greater than 1 millimeter, or even greater than 2 millimeters or greater than 4 millimeters or greater than 10 millimeters.

FIG. 2C illustrates an embodiment in which the edge 4 has, in addition to the chamfer 8, a further chamfer 10 adjoining said first chamfer. Here, too, it was found to be advantageous if the value in relation to the chamfer 8 of the chamfer angle β of the further chamfer 10, which adjoins the chamfer 8, lies within the ranges specified above in respect of the exemplary embodiment of FIG. 2B.

FIG. 2D shows a further exemplary embodiment, in which the edge 4 has a rounding 17. It was found to be advantageous if a minimum rounding radius R of the rounding 17 is greater than 1 millimeter, or even greater than 2 millimeters or greater than 5 millimeters or greater than 10 millimeters at each position within the edge section 7. As seen in a cross-sectional plane extending transversely to the edge profile, the rounding 17 can deviate from the form of a circular arc and may have different rounding radii. Then, the minimum rounding radius R is the smallest rounding radius of the rounding 17 in this cross-sectional plane. $|E|=|U/R|$ approximately applies to the electric field strength E at the edge 8, where U denotes the plasma potential. Consequently, the electric field strength E at the edge 8 reduces with increasing rounding radius R.

As an alternative to the examples illustrated in FIGS. 2B to 2D, the edge 4 could have a combination of a rounding and one or more chamfers.

Figure 3:
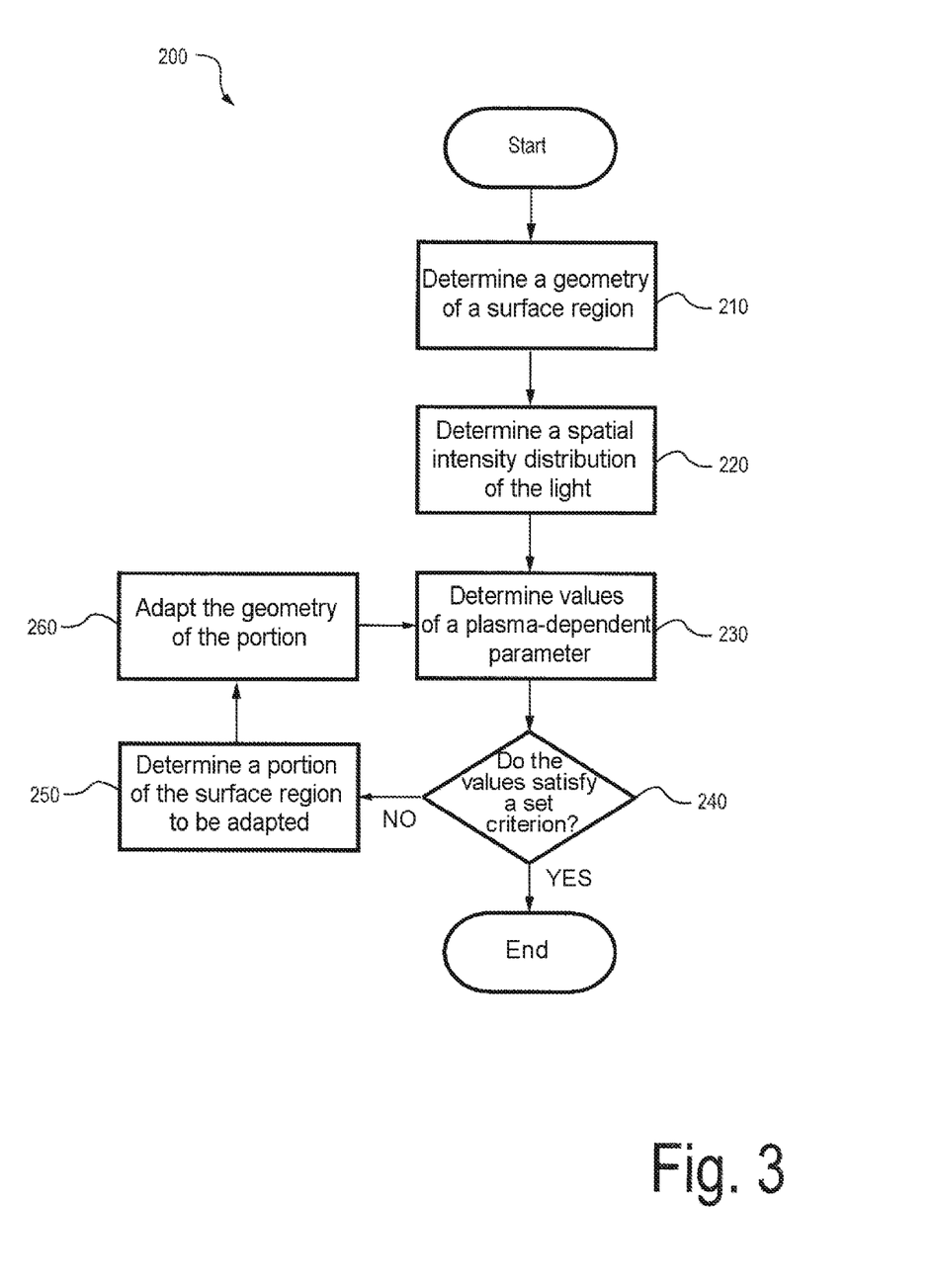
FIG. 3 shows a schematic illustration of an exemplary method for adapting a geometry of a surface region of a component of an optical arrangement.

FIG. 3 illustrates an exemplary method 200 for adapting the geometry of at least one surface region of the substrate body 9, shown in FIG. 1, according to one exemplary embodiment. As explained in more detail below, the geometry is adapted on the basis of a calculation of values of a plasma-dependent parameter.

The method comprises a determination 210 of a geometry of a surface region of the substrate body 9. By way of example, determining 210 the geometry may comprise a creation of a surface model and/or a point cloud, which respectively represent the surface region.

The exemplary method further comprises a determination 220 of a spatial intensity distribution of the light during the operation of the EUV lithography apparatus 101 (shown in FIG. 5). The spatial intensity distribution is determined within a spatial region that adjoins the surface region of the substrate body 9. Intensity distributions for different times within a light pulse of the pulsed EUV light source 102 (shown in FIG. 5) are determined in the exemplary method. However, a satisfactory accuracy may be obtained under the assumption of continuous radiation, even if the EUV light source 102 is a pulsed light source. By way of example, the spatial intensity distribution can be determined with the aid of a ray tracing algorithm, which is used to calculate at least a section of the beam path of the EUV lithography apparatus 101.

A transient simulation of the plasma over the duration of the light pulse is implemented on the basis of the determined spatial intensity distribution for a plurality of times within the light pulse. In the exemplary method 200, the plasma simulation is a hydrodynamic simulation, for example, using a multi-fluid model in the drift-diffusion approximation. Alternatively, modeling can also be implemented for example with kinetic "particle in cell" simulations.

In the simulation, volume reactions, recombination reactions and surface reactions of the plasma species that are caused by electronic, atomic and molecular collisions are taken into account. Furthermore, the emission of secondary electrons and backscattering of electrons at surfaces are taken into account. Furthermore, photoionization and photoemission processes caused by the radiated-in EUV light are taken into account. In so doing, it was found that a sufficient accuracy can be achieved if only the direct photoionization reaction is taken into account. The dissociative ionization and the dual ionization of $H_2$ can additionally be taken into account in order to obtain a greater accuracy. In the exemplary method, all relevant homogeneous reactions and heterogeneous reactions with the bounding surfaces are taken into account for the simulation of the plasma, as are specified, for example, in tables 1 and 2 of the article "Atom and Ion Chemistry in Low Pressure Hydrogen DC Plasmas" by I. Mendez et al., published in J. Phys. Chem. A 2006, 110, pages 6060-6066. If required, substantially more detailed information can be gathered in the overview article "Collision Processes in Low-Temperature Hydrogen Plasma" by R. Janev et al., Berichte des Forschungzentrums Jülich 4105, ISSN 0944-2952). The entire content of these documents is incorporated into the present Continuation application by reference.

Values of a plasma-dependent parameter are then determined 230 in the exemplary method 200. Here, the plasma-dependent parameter is determined on the basis of the transient simulation of the plasma. The flux density of the following ion species of the simulated plasma on the surface of the (coated) substrate body is used as plasma-dependent parameter: $H_2^+$, $H_3^+$, $H^+$, and $H^-$. The flux density of the ion species is calculated at a plurality of locations of the surface region of the substrate body 9 or of the reflecting optical element 1 in order thus to obtain a flux density distribution.

Figure 4:
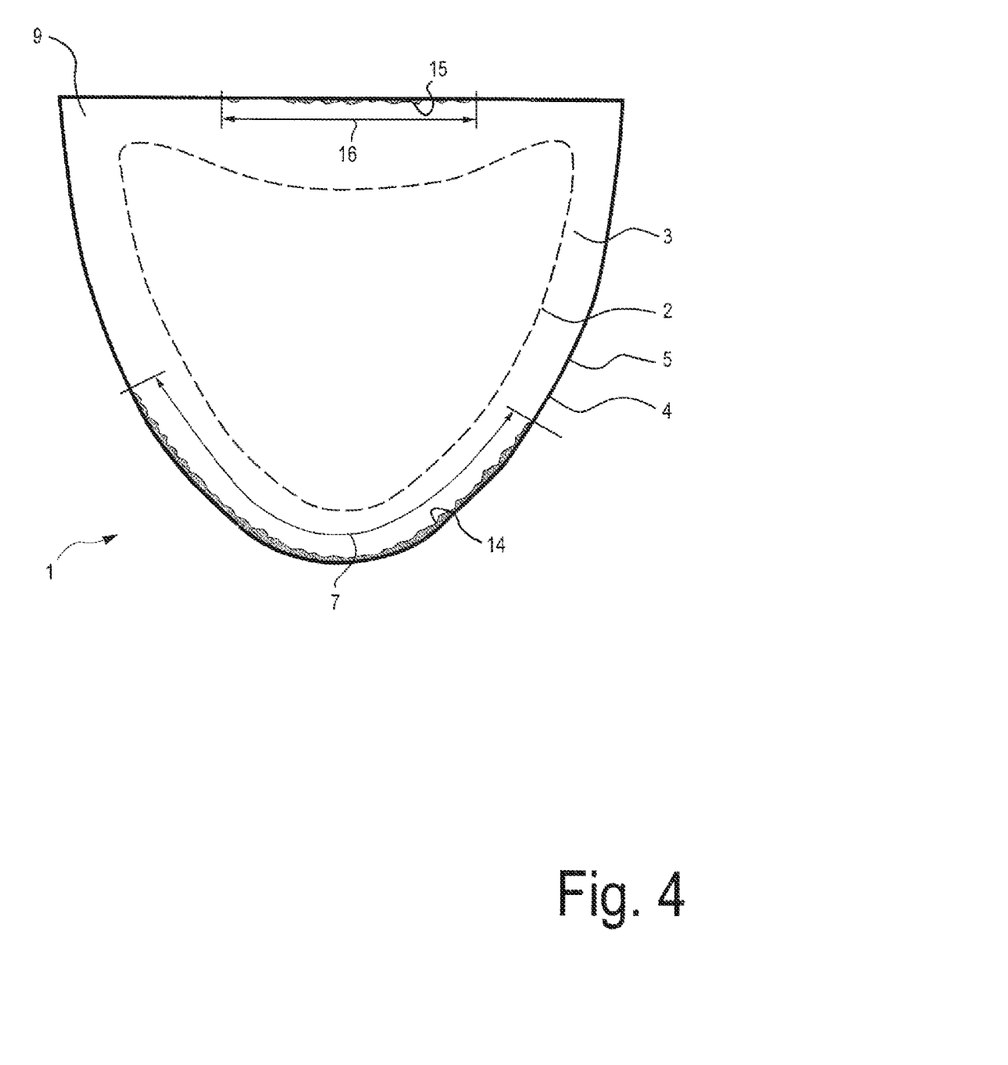
FIG. 4 shows a schematic illustration of a calculated flux density of ion species on the surface of a reflective element, as obtained by the exemplary method illustrated in FIG. 3.

FIG. 4 illustrates the calculated flux density distribution of the ion species at the surface of the coated substrate body 9, as is shown in perspective fashion in FIG. 1.

FIG. 4 marks regions 14 and 15, in which elevated values of the flux density of the ion species have been calculated. The elevated values of the flux density are significantly higher than the flux density at the surrounding locations of the examined surface region. A comparison of the calculated flux density distribution of the ion species with the damaged mirror body 1 has shown that defects, for example in the form of sputtering defects and delaminations, occur more frequently precisely in regions 14 and 15. The calculated electric field strength, the calculated plasma potential and the calculated flux density of hydrogen radicals also showed a correlation with the damaged regions.

Therefore, in the exemplary method, a check as to whether, or in what regions, the occurrence of defects, for example in the form of sputtering defects and delaminations, is to be expected is carried out by determining values of flux density distribution of ion species on the surface of the substrate body 9.

By way of example, a criterion can be set on the basis of comparison experiments, said criterion allowing a check to be carried out as to whether impairing defects, for example in the form of sputtering defects, delaminations and/or particle accumulations, are to be expected in the assumed geometry of the surface region underlying the simulation.

By way of example, the criterion may comprise a threshold for the values of the plasma-dependent parameter. If values for the flux density of the ion species that are lower than the threshold occur in regions 14 and 15, the geometry of the surface region satisfies the set criterion (YES in 240) and no further adaptations are necessary.

By contrast, should the set criterion not be satisfied (NO in 240) because one or more of the calculated values for the flux density of the ion species exceed the threshold, a portion of the surface region in which the geometry should be adapted is determined 250. In the illustrated example, it is determined on the basis of the calculated values for the flux density distribution, as reproduced in FIG. 4, that the geometry of the edge 4 should be adapted at least in edge sections 7 and 16. By way of example, the geometry of the edge 4 in edge sections 7 and 16 can be adapted by one or more chamfers and/or by a rounding, as was explained with reference to FIGS. 2B to 2D.

Then, a transient simulation of the plasma is carried out, once again, with the adapted geometry of the edge 4 in the edge sections 7 and 16. Then, once again, values of the plasma-dependent parameter are determined 230 with the aid of the simulation of the plasma on the basis of the adapted geometry of the edge 4. Determining 230 the values of the plasma-dependent parameter, checking 240 whether the values of the plasma-dependent parameter meet the set criterion, determining 250 the portion to be adapted and adapting 260 the geometry of the portion are implemented in this sequence until the values of the plasma-dependent parameter meet the set criterion (YES in 240).

Consequently, the exemplary method allows the provision of mirror bodies for the EUV lithography apparatus, with which the reliability and longevity of the EUV lithography apparatus are ensured.

The exemplary method, which is illustrated in FIG. 3, could additionally or alternatively be carried out on the basis of a plasma-dependent parameter that differs from the flux density of the ion species. By way of example, the plasma potential, the plasma density, the electron density, the election flux density and/or the electric field strength can be used as an additional or alternative plasma-dependent parameter. These plasma-dependent parameters can also be calculated on the basis of the simulation of the plasma.

Since, as described above, the flux of neutral species may be coupled to the flux of ion species, the flux density of one or more neutral species could also be used, additionally or alternatively, as a plasma-dependent parameter. By way of example, the flux density of hydrogen radicals can be used as a plasma-dependent parameter.

As described below, the method illustrated in FIG. 3 can advantageously also be applied to components of the EUV lithography apparatus that are not reflecting optical elements.

It was found that so-called hydrogen-induced outgassing of components within the vacuum apparatus occurs when the hydrogen plasma is used. The reason for this lies in the fact that some elements form volatile hydrides in the presence of hydrogen ions and/or hydrogen radicals. Examples of such elements include tin, zinc, phosphorus, silicon, lead and fluorine. This hydrogen-induced outgassing may reach the optically effective regions of the mirror bodies, the elements that form the volatile hydrides then being deposited thereon as contaminations. These contaminations can be irreversible.

It was found that the application of the exemplary method 200 illustrated in FIG. 3 to components where these instances of hydrogen-induced outgassing occur is advantageous. Therefore, these components need not be part of a reflective optical element. From all components in the EUV lithography apparatuses, said components are identified on the basis of their proportion of the elements of tin, zinc, phosphorus, silicon, lead, fluorine, etc. The selection can be restricted to those components that are exposed to the hydrogen plasma.

Once these components are determined, the exemplary method illustrated in FIG. 3 is then carried out in order to adapt a geometry of a surface region of these components. By way of example, this can be implemented by adapting a geometry of an edge of the component. This provides a method that allows hydrogen-induced outgassing to be suppressed or prevented.

FIG. 5 schematically shows the design of the EUV lithography apparatus 101. The EUV lithography apparatus 101 comprises the EUV light source 102 for producing EUV radiation, which has a high energy density in the EUV wavelength range below 50 nanometers, in particular between approximately 5 nanometers and approximately 15 nanometers. The EUV light source 102 can be embodied, for example, in the form of a plasma light source for generating a laser-induced plasma. The EUV lithography apparatus 101 furthermore comprises a collector mirror 103 in order to focus the EUV light of the EUV light source 102 to form an illumination beam 104 and to increase the energy density further in this way. The illumination beam 104 serves to illuminate a structured object M using an illumination system, which in the present example has three reflective optical elements 114 to 116 (mirrors) and a stop 106. Further, the illumination system comprises a grating 107 for spectral filtering of the EUV light. The first and second reflective optical element 114, 115 of the illumination system can be a facet mirror with a plurality of facet elements, which, where necessary, are movable about at least one axis in order to set the angle of incidence of the illumination beam 104 on the respective facet surface.

The structured object M can be for example a reflective photomask, which has reflective and non-reflective, or at least less reflective, regions for producing at least one structure on the object M. Alternatively, the structured object M may be a plurality of micromirrors, which are disposed in a one-dimensional or multi-dimensional arrangement and which are possibly movable about at least one axis, in order to set the angle of incidence of the EUV light 104 on the respective mirror.

The structured object M reflects part of the illumination beam 104 and shapes a projection beam path 105, which carries the information about the structure of the structured object M and is radiated into a projection lens with an optical axis A, said projection lens producing a projected image of the structured object M or of a respective partial region thereof on a substrate W. The substrate W, for example a wafer, has a semiconductor material, for example silicon, and is disposed on a mounting, which is also referred to as a wafer stage WS.

In the present example, the projection lens 120 has six reflective optical elements 121 to 126 (mirrors) in order to generate an image of the structure that is present on the structured object M on the wafer W. The number of mirrors in a projection lens typically lies between four and eight; however, only two mirrors or else up to 10 mirrors can also be used, if appropriate.

In order to achieve a high imaging quality in the imaging of a respective object point OP of the structured object M onto a respective image point IP on the wafer W, extremely stringent requirements are to be made in respect of the surface shape of the mirrors 121 to 126; and the position or the alignment of the mirrors 121 to 126 in relation to one another and in relation to the object M and the substrate W also requires precision in the nanometers range.

What is claimed is:

1. A method for adapting a geometry of at least one surface region of a component of an optical arrangement; wherein the optical arrangement is configured for light having at least one wavelength in an extreme ultraviolet (EUV) wavelength range and wherein the component is disposed in a vacuum chamber containing residual gas;
said method comprising:
determining at least one value of a plasma-dependent parameter, wherein the plasma-dependent parameter depends on a plasma that is produced by an interaction of the light with at least some of the residual gas; and
adapting the geometry of the surface region of the component in accordance with the determined value of the plasma-dependent parameter.

2. The method as claimed in claim 1, wherein the component has an edge, which forms at least part of a boundary of an edge-free surface of the component; and
wherein the adapted surface region of the component has an edge section of the edge, wherein the edge section extends along a direction of extent of the edge.

3. The method as claimed in claim 2, wherein the component is a reflective optical element of the optical arrangement, wherein the reflective optical element has:
an optically effective region that is configured to reflect the light incident on a surface of the optically effective region;
wherein the edge-free surface includes the surface of the optically effective region.

4. The method as claimed in claim 1, wherein said adapting or the geometry of the surface region of the component comprises:
determining, on the basis of the value of the plasma-dependent parameter, a value and/or a value range of one of the following parameters or a combination of the following parameters:
a radius of curvature (R) of a rounding of the edge in the edge section;
a chamfer angle (β) of the edge in the edge section; and/or
a chamfer width (d) of the edge in the edge section.

5. The method as claimed in claim 1, wherein the adapted surface region is a portion of a surface of the component;
wherein the method further comprises:
determining the portion within the surface of the component on the basis of the at least one value of the plasma-dependent parameter.

6. The method as claimed in claim 1, further comprising:
determining the component from a plurality of components of the optical arrangement on the basis of a chemical composition of a respective one of the plurality of components.

7. The method as claimed in claim 6, wherein the component is determined on the basis of a proportion of one element or a combination of the following elements in the respective component: tin, zinc, phosphorus, silicon, lead and/or fluorine.

8. The method as claimed in claim 1, wherein the plasma-dependent parameter is one of the following parameters:
a flux density of one or more ion species of the plasma;
a flux density of one or more neutral species of the plasma;
a flux density of one or more radical species of the plasma; or an electron flux density.

9. The method as claimed in claim 1, wherein the plasma-dependent parameter is one of the following parameters:
a plasma potential;
an electric field strength;
a plasma density; or
an electron density.

10. The method as claimed in claim 1, further comprising:
determining a spatial intensity distribution of the light, wherein the plasma-dependent parameter is determined on the basis of the spatial intensity distribution of the light.

11. The method as claimed in claim 1, wherein the plasma is produced from an interaction of the light with one of the following substances or a combination of the following substances as a constituent of the residual gas:
hydrogen, argon, helium, oxygen and/or nitrogen.

12. A computer program product, comprising program parts that, when loaded onto a computer, perform the method as claimed in claim 1.

13. A reflective optical element for reflecting light having at least one wavelength in an EUV wavelength range, comprising:
an optically effective region that is configured to reflect the light incident on a surface of the optically effective region, and
an edge containing at least part of a boundary of an edge-free surface of the reflective optical element, wherein the edge-free surface includes the surface of the optically effective region,
wherein the edge has a chamfer and/or a rounding, at least along an edge section that extends along a direction of extent of the edge,
wherein the optically effective region is configured for reflecting the light at an angle of incidence of greater than 60 degrees, and
wherein the angle of incidence is measured between a direction of incidence of the light and a surface normal of the surface of the optically effective region.

14. The reflective optical element as claimed in claim 13, wherein the edge has an edge angle ($\alpha$) with a value of between 30 degrees and 150 degrees at each location within the edge section.

15. The reflective optical element as claimed in claim 13, wherein the edge has the chamfer,
wherein a chamfer angle ($\beta$) of the chamfer, measured at a side of the chamfer adjoining the edge-free surface, is greater than 20 degrees at each location within the edge section.

16. The reflective optical element as claimed in claim 13, wherein the edge has the chamfer,
wherein a chamfer width (d) of the chamfer has a value that is greater than 1 millimeter at each location within the edge section.

17. The reflective optical element as claimed in claim 13, wherein the edge has the rounding;
wherein a minimum rounding radius (R) of the rounding is greater than 1 millimeter at each location within the edge section.

18. The reflective optical element as claimed in claim 13, wherein
at least part of a substrate body of the reflective optical element is manufactured from a metal and/or
at least one region of the edge-free surface adjoining the edge section has a conductive layer.

19. The reflective optical element as claimed in claim 13, wherein the optically effective region has alternating first layers made of a first layer material and second layers made of a second layer material.

20. An optical arrangement for light having at least one wavelength in an EUV wavelength range, comprising:
a reflective optical element disposed in a beam path of the light and configured to reflect the light, the reflective optical element includes:
an optically effective region that is configured to reflect the light incident on a surface of the optically effective region, and
an edge containing at least part of a boundary of an edge-free surface of the reflective optical element, wherein the edge-free surface includes the surface of the optically effective region, wherein the edge has a chamfer and/or a rounding, at least along an edge section that extends along a direction of extent of the edge; and
a structured object,
wherein the optical arrangement is embodied to illuminate the structured object using the light and to project structures of the structured object onto an image plane.

21. The optical arrangement as claimed in claim 20, wherein the reflective optical element is a reflective optical element disposed adjacent to and upstream of the structured object, as seen along the beam path.

22. The optical arrangement as claimed in claim 20, wherein reflected light beams of the light, which are reflected by the structured object, approach the edge to within a distance of less than 50 mm.

23. The optical arrangement as claimed in claim 20, wherein the structured object has a structure thereon and is distinct from the reflective optical element.

* * * * *